(12) United States Patent
Kim et al.

(10) Patent No.: US 10,164,190 B2
(45) Date of Patent: Dec. 25, 2018

(54) ORGANIC SEMICONDUCTOR COMPOUND AND METHOD FOR MANUFACTURING THE SAME

(71) Applicants: SOONGSIL UNIVERSITY RESEARCH CONSORTIUM TECHNO PARK, Seoul (KR); INDUSTRY-UNIVERSITY COOPERATION FOUNDATION HANYANG UNIVERSITY, Seoul (KR)

(72) Inventors: Do Hwan Kim, Anyang-si (KR); Hojin Lee, Seoul (KR); Han Wool Park, Seoul (KR); Keun-Yeong Choi, Seoul (KR)

(73) Assignees: SOONGSIL UNIVERSITY RESEARCH CONSORTIUM TECHNO-PARK, Seoul (KR); Industry-University Cooperation Foundation Hanyang University, Seoul (KR)

( * ) Notice: Subject to any disclaimer, the term of this patent is extended or adjusted under 35 U.S.C. 154(b) by 124 days.

(21) Appl. No.: 14/986,852

(22) Filed: Jan. 4, 2016

(65) Prior Publication Data
US 2016/0276590 A1    Sep. 22, 2016

(30) Foreign Application Priority Data

Mar. 19, 2015  (KR) .................. 10-2015-0038424
Jul. 10, 2015  (KR) .................. 10-2015-0098309

(51) Int. Cl.
*B01J 20/22* (2006.01)
*C23C 18/12* (2006.01)
(Continued)

(52) U.S. Cl.
CPC ........ *H01L 51/0036* (2013.01); *B01J 20/226* (2013.01); *C23C 18/1204* (2013.01);
(Continued)

(58) Field of Classification Search
CPC ................. C09K 11/02; C09K 11/025; B01D 2253/204; B01J 20/226
See application file for complete search history.

(56) References Cited

U.S. PATENT DOCUMENTS 4,946,710 A * 8/1990 Miller ................... C04B 35/491
                                                    252/62.9 PZ
6,653,701 B1 * 11/2003 Yamazaki ............ H01G 9/2031
                                                    136/248
(Continued)

FOREIGN PATENT DOCUMENTS

CN    101230265 A    7/2008
CN    102015900 A    4/2011
(Continued)

OTHER PUBLICATIONS

European Search Report for 15203122.5 dated Jul. 15, 2016.

*Primary Examiner* — Eric R Smith
(74) *Attorney, Agent, or Firm* — Sughrue Mion, PLLC

(57) ABSTRACT

An organic semiconductor compound and a method for manufacturing the same is provided. The method for manufacturing the organic semiconductor compound may include stirring a solated organic semiconductor and a solated organometallic precursor. Herein, the manufacturing the organic semiconductor compound includes: forming a three-dimensional organic semiconductor compound by allowing the solated organic semiconductor to orthogonally penetrate one or more gaps in a lattice structure of a gelated organometallic precursor formed by stirring the solated organometallic precursor.

12 Claims, 16 Drawing Sheets

(51) Int. Cl.
　　　*H01L 51/00*　　　(2006.01)
　　　*H01L 51/42*　　　(2006.01)
　　　*H01L 51/50*　　　(2006.01)
　　　*H01L 51/05* 　　　(2006.01)

(52) U.S. Cl.
　　　CPC ...... *C23C 18/1254* (2013.01); *H01L 51/0004* (2013.01); *H01L 51/0094* (2013.01); *H01L 51/004* (2013.01); *H01L 51/0035* (2013.01); *H01L 51/0558* (2013.01); *H01L 51/42* (2013.01); *H01L 51/5012* (2013.01); *Y02E 10/549* (2013.01); *Y02P 70/521* (2015.11)

(56) References Cited

U.S. PATENT DOCUMENTS

| | | | |
|---|---|---|---|
| 2004/0075120 A1 | 4/2004 | Wu | |
| 2007/0152370 A1 | 7/2007 | Roberts | |
| 2011/0049560 A1* | 3/2011 | Li | C09K 11/883 257/103 |
| 2013/0203198 A1* | 8/2013 | Min | H01L 51/428 438/46 |

FOREIGN PATENT DOCUMENTS

| | | |
|---|---|---|
| CN | 102969277 A | 3/2013 |
| KR | 10-2014-0033466 A | 3/2014 |
| WO | 2012/164282 A1 | 12/2012 |

* cited by examiner

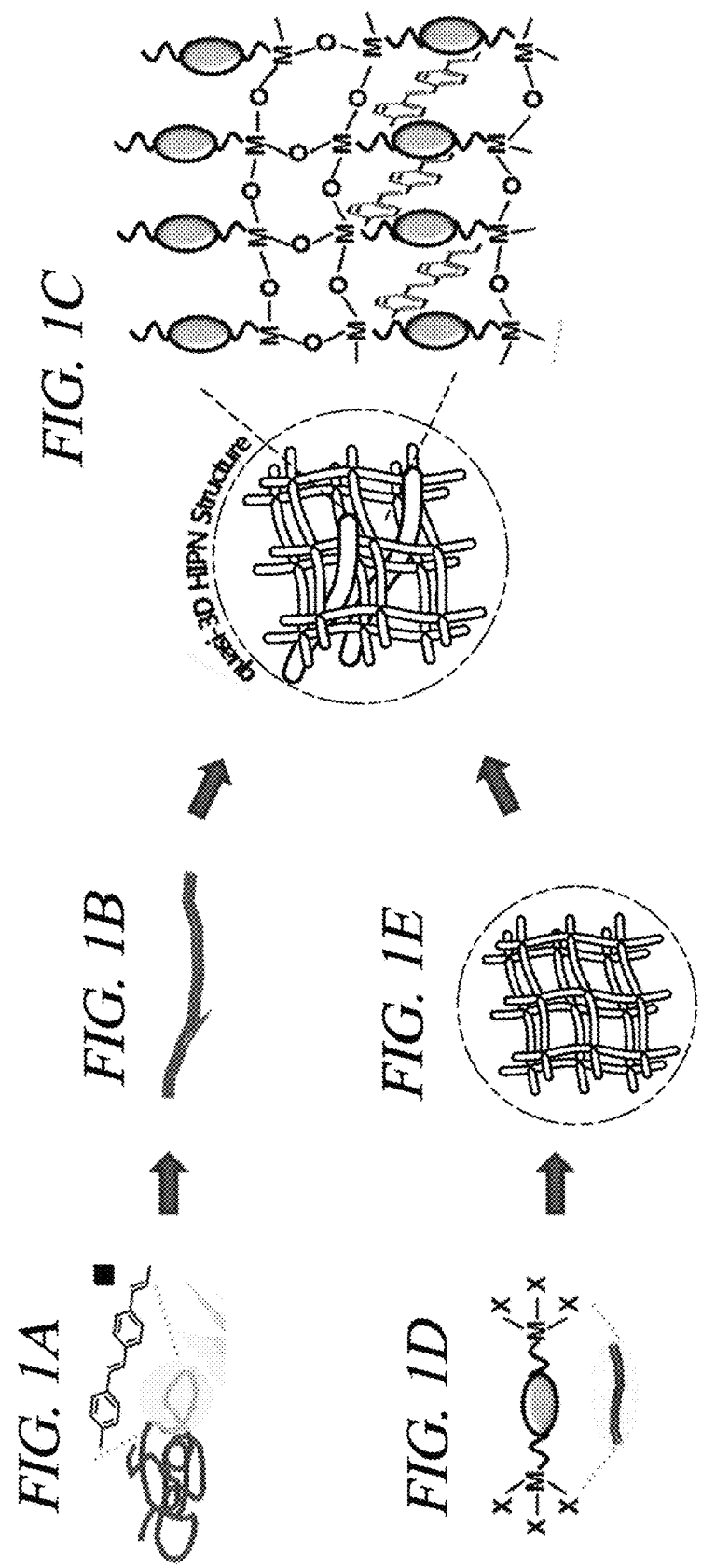

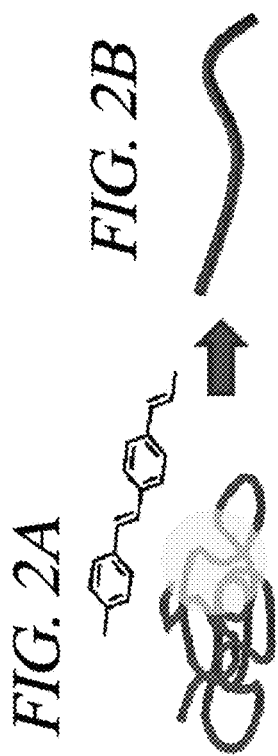
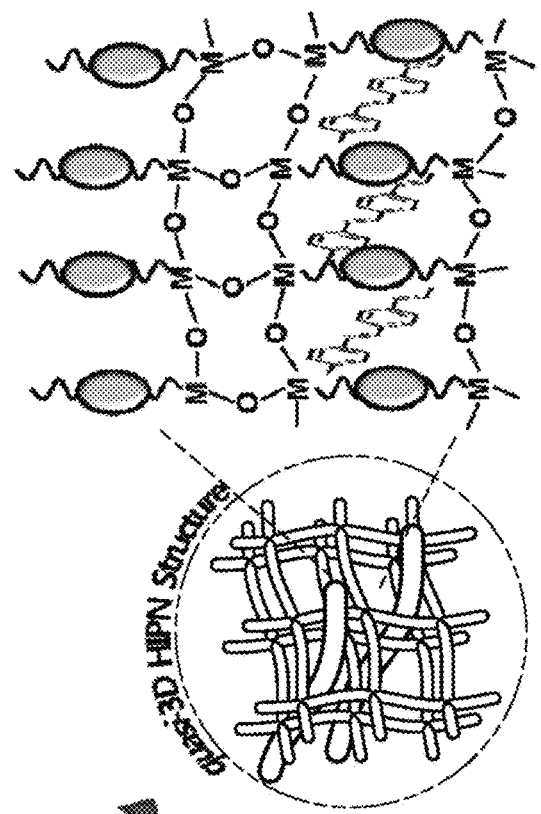
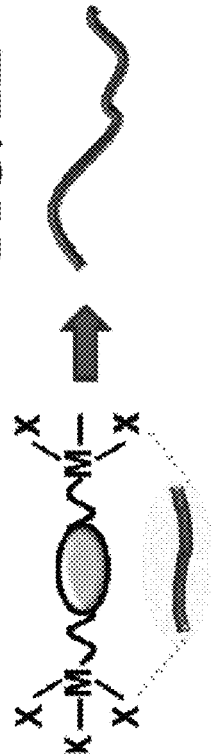
FIG. 2A  FIG. 2B  FIG. 2C  FIG. 2D  FIG. 2E

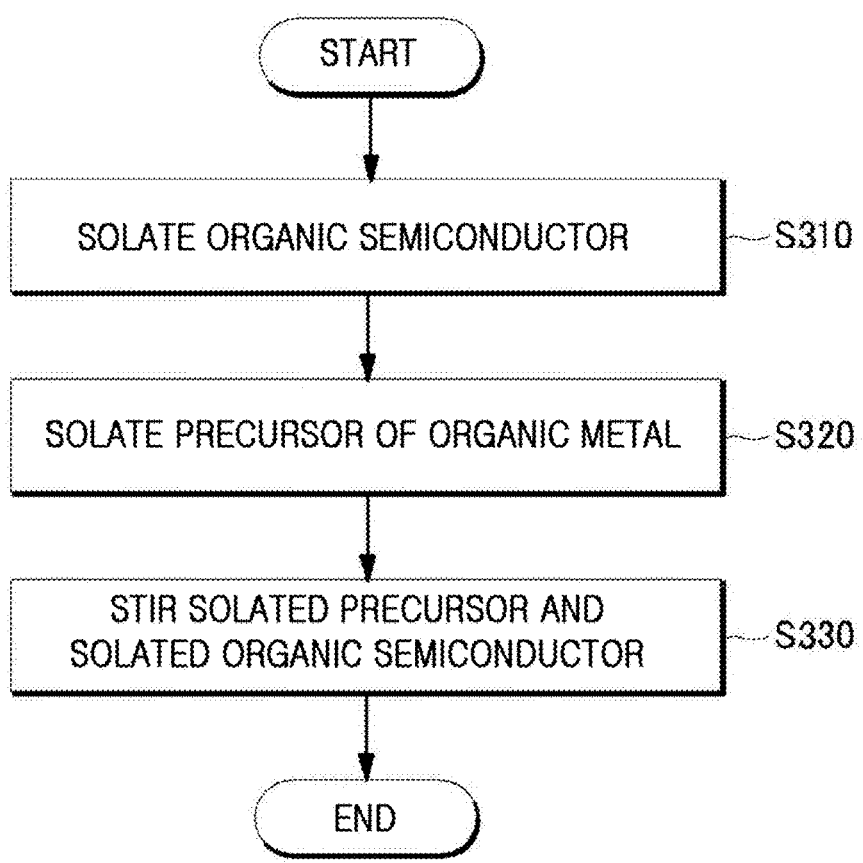

ORGANIC SEMICONDUCTOR COMPOUND AND METHOD FOR MANUFACTURING THE SAME

CROSS-REFERENCE TO RELATED APPLICATION

This application claims the benefit of Korean Patent Application No. 10-2015-0038424 filed on Mar. 19, 2015, and Korean Patent Application No. 10-2015-0098309 filed on Jul. 10, 2015, the entire disclosures of which are incorporated herein by reference.

STATEMENT REGARDING THIRD PARTY RESEARCH PROJECT

This invention was supported by Samsung Research Funding Center of Samsung Electronics under Project Number SRFC-MA1501-00.

TECHNICAL FIELD

The present disclosure relates to an organic semiconductor compound and a method for manufacturing the same.

BACKGROUND

An organic semiconductor is dissolved in a photosensitive resin or solvent used in a silicon-based semiconductor process. For this reason, the organic semiconductor cannot be applied to a conventional photolithography process for patterning with high resolution. In order to form one or more patterns on the organic semiconductor, a shadow mask method or a printing method has been used. However, these methods have many limitations in forming a sub-micron pattern with ultrahigh resolution.

In order to form a sub-micron pattern on the organic semiconductor, photosensitive resins and solvents customized for the organic semiconductor are being developed in the U.S., Japan, and Europe. However, a method of forming a pattern on the organic semiconductor using the customized photosensitive resins and solvents has problems of an increase in processing cost caused by using a new photosensitive resin material and complicated process. Further, while this method can be applied in forming a pattern on a single organic semiconductor layer, this method cannot be used in forming a pattern on a multilayer structure.

In this regard, Korean Patent Laid-open Publication No. 10-2014-0033466 (entitled "Organic semiconductor compositions") discloses organic semiconductor layers and devices comprising organic semiconductor compositions, and also discloses applications of the organic semiconductor compositions in the field of displays such as organic field effect transistors (OFETS), integrated circuits, organic light emitting diodes (OLEDS), photodetectors, organic photovoltaic (OPV) cells, sensors, lasers, memory elements, and logic circuits.

SUMMARY

In view of the foregoing, some exemplary embodiments of the present disclosure provide an organic semiconductor compound available for a continuous solution process and a method for manufacturing the same.

However, problems to be solved by the present disclosure are not limited to the above-described problems. Although not described herein, other problems to be solved by the present disclosure can be clearly understood by those skilled in the art from the following descriptions.

In an aspect of the present disclosure, there is provided a method for manufacturing an organic semiconductor compound, including: manufacturing an organic semiconductor compound by stirring a solated organic semiconductor and a solated organometallic precursor. Herein, the manufacturing an organic semiconductor compound includes: forming a three-dimensional organic semiconductor compound by allowing the solated organic semiconductor to orthogonally penetrate one or more gaps in a lattice structure of a gelated organometallic precursor formed by stirring the solated organometallic precursor.

In another aspect of the present disclosure, there is provided a method for manufacturing an organic semiconductor compound, including: manufacturing an organic semiconductor compound by stirring the solated organic semiconductor and a gelated organometallic precursor. Herein, the manufacturing an organic semiconductor compound includes: forming the three-dimensional organic semiconductor compound by gelating the solated organometallic precursor and allowing the solated organic semiconductor to orthogonally penetrate one or more gaps in a lattice structure of the gelated organometallic precursor.

In yet another aspect of the present disclosure, there is provided an organic semiconductor compound having the three-dimensional network structure in which the solated organic semiconductor orthogonally penetrates one or more gaps between gelated organometallic precursor structures each having a two-dimensional lattice structure.

The organic semiconductor compound suggested in the present disclosure has a chemical resistance and an etch resistance and can be applied to a conventional photolithography process.

Further, the organic semiconductor compound is available for a continuous solution process for manufacturing an ultrahigh-resolution tandem-type organic electronics platform and able to increase efficiency of the process.

Furthermore, it is possible to synthesize various reactors with organometallic precursors to be bonded to the organic semiconductor. Therefore, application of the organic semiconductor compound in various fields, such as optical receivers and optical emitters would be possible.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 1A-FIG. 1E provide diagrams illustrating a manufacturing process of an organic semiconductor compound in accordance with an exemplary embodiment of the present disclosure.

FIG. 2A-FIG. 2E provide diagrams illustrating a manufacturing process of an organic semiconductor compound in accordance with another exemplary embodiment of the present disclosure.

FIG. 4B is a flowchart provided to describe a method for manufacturing an organic semiconductor compound in accordance with another exemplary embodiment of the present disclosure in detail.

DETAILED DESCRIPTION

Figure 3A:
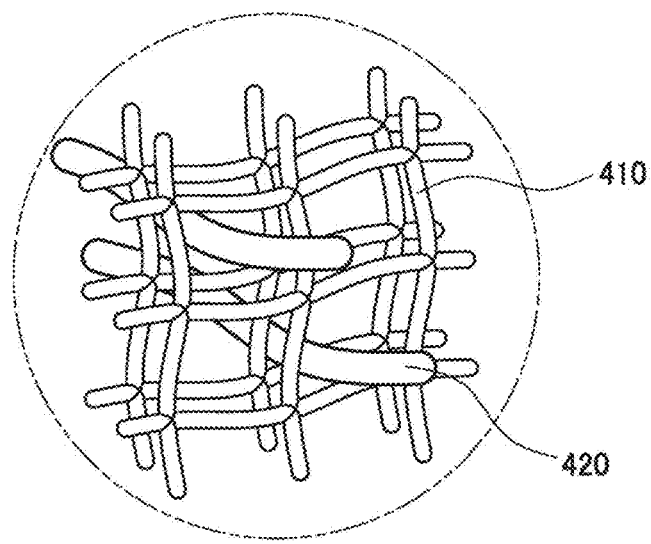
FIG. 3A-FIG. 3B are schematic diagram illustrating a structure of an organic semiconductor compound in accordance with an exemplary embodiment of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case in which an element is "directly connected or coupled to" another element, and a case in which an element is "electronically connected or coupled to" another element via still one or more other elements. Further, the term "comprises or includes" and/or "comprising or including" used in the document means that one or more other components, steps, operation and/or existence or addition of elements are not excluded in addition to the described components, steps, operation and/or elements unless context dictates otherwise.

Electrical characteristics and optical characteristics of an organic electronic material can be easily controlled and modified through molecular design. Further, the organic electronic material can be easily used for a solution process and mass production. In addition, the organic electronic material is light weight and excellent in flexibility, and also has a high affinity with a biomaterial. Therefore, the organic electronic material has received much attention as a key material of bio-elements, next-generation electronic devices, and optoelectronic devices.

In particular, an organic semiconductor has a π-conjugated structure in which a single bond and a multiple bond of carbon atoms are alternately repeated. Representative examples of a polymer material having a π-conjugated structure may include polyacetylene, polypyrrole, polyaniline, polythiophene (PTh), poly(p-phenylenevinylene) (PPV), and derivatives thereof. Examples of a small molecule having a π-conjugated structure may include pentacene, perylene, rubrene, and phthalocyanine.

The organic semiconductor is light weight and excellent in flexibility, workability, and a large-area processing characteristic. Further, structural, optical, and electrical characteristics of the organic semiconductor can be regulated by doping. Therefore, the organic semiconductor has been used as an active layer of optoelectronic devices such as an organic light emitting diode (OLED), an organic field-effect transistor (OFET), an organic photovoltaic cell (OPVC), and an electrochromic device.

Further, in the organic semiconductor, a self-assembly phenomenon progresses depending on a balance between π-π stacking interactions occurring between π-planes as a main frame of a π-conjugated structure and hydrophobic interactions occurring between alkyl-based side chains. Therefore, in a low-molecular weight organic semiconductor, a one-dimensional self-assembly formed in solution phase can be manufactured by suppressing lateral growth caused by hydrophobic interactions between side chains and inducing dominant occurrence of π-π stacking interactions occurring between π-planes. In this case, overlapping of π-orbitals between molecules mainly occurs in a major axis direction of the one-dimensional structure, and, thus, the optimized charge transport direction becomes the major axis of the structure. Therefore, the organic semiconductor may adopt various manufacturing methods depending on a molecular structure.

An exemplary embodiment of the present disclosure relates to a method for manufacturing an organic semiconductor compound having a three-dimensional network structure by stirring an organometallic precursor having a two-dimensional network structure in a state where an organic semiconductor is dissolved in a solvent.

The organic semiconductor compound synthesized from the organometallic precursor and the organic semiconductor according to an exemplary embodiment of the present disclosure has a characteristic of being "orthogonal", which means that the organic semiconductor compound has a concept of being "mutually independent" as well as a concept of being "orthogonal", which refers to multiple lines at a right angle to each other. That is, the organometallic precursor and the organic semiconductor may function in a mutually independent manner. In other words, the organometallic precursor does not decrease or increase the electrical characteristics of the organic semiconductor. Further, the organometallic precursor does not have any influence on a function of the organic semiconductor. However, the organic semiconductor compound according to an exemplary embodiment of the present disclosure has a shape in which the organic semiconductor orthogonally penetrates one or more gaps in a lattice structure of the organometallic precursor formed into a two-dimensional network structure. Due to this two-dimensional network structured shape, the organic semiconductor compound according to an exemplary embodiment of the present disclosure has a chemical resistance and an etch resistance. Therefore, the organic semiconductor compound is applicable to a conventional photolithography process, available for a continuous solution process, and able to increase efficiency of the process.

Hereinafter, the organic semiconductor compound and a method for manufacturing the same according to an exemplary embodiment of the present disclosure will be described in detail with reference to the accompanying drawings.

FIG. 1A-FIG. 1E provide diagrams illustrating a manufacturing process of the organic semiconductor compound in accordance with an exemplary embodiment of the present disclosure, and FIG. 2A-FIG. 2E provide diagrams illustrating a manufacturing process of the organic semiconductor compound in accordance with another exemplary embodiment of the present disclosure.

To be specific, referring to FIG. 1A-FIG. 1E, an organic semiconductor shown in FIG. 1A may be solated as can be seen from FIG. 1B, and the organometallic precursor shown in FIG. 1D may be gelated as can be seen from FIG. 1E. In FIG. 1D, M in the organometallic precursor denotes metal and X denotes a reactor. Herein, the reactor X may be formed by synthesizing various materials suitable for purposes.

According to an exemplary embodiment of the present disclosure, when a solated organic semiconductor in FIG. 1B and the gelated organometallic precursor in FIG. 1E are mixed and thoroughly stirred, the organic semiconductor compound having the three-dimensional network structure as shown in FIG. 1C can be formed.

Meanwhile, as illustrated in FIG. 2A-FIG. 2E, the organic semiconductor in FIG. 2A may be solated as can be seen from FIG. 2B and the organometallic precursor in FIG. 2D may be solated as can be seen from FIG. 2E. When the solated organic semiconductor in FIG. 2A and the solated organometallic precursor in FIG. 2E are mixed and thoroughly stirred, the organic semiconductor compound having the three-dimensional network structure as shown in FIG. 2C can be formed, in the same manner as shown in FIG. 1A-FIG. 1E.

Figure 3B:
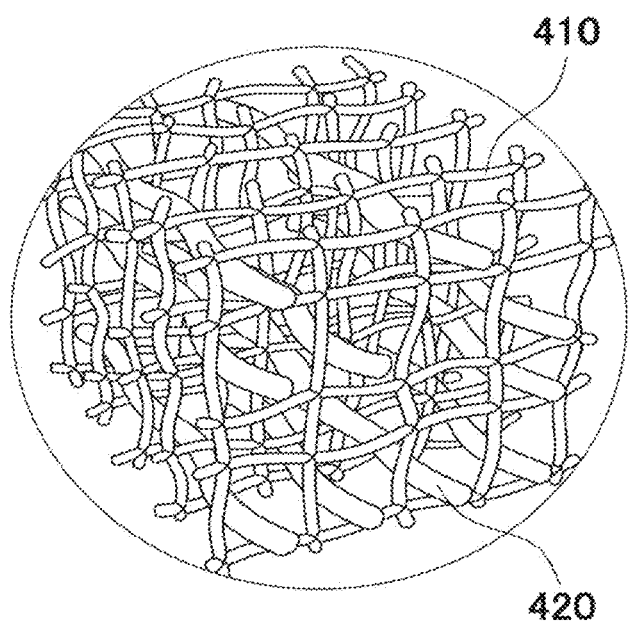

FIG. 3A-3B are schematic diagram illustrating a structure of the organic semiconductor compound in accordance with an exemplary embodiment of the present disclosure.

Referring to FIGS. 3A-3B, the organic semiconductor compound according to an exemplary embodiment of the present disclosure is formed into a shape in which the solated organic semiconductor 420 orthogonally penetrates one or more gaps in a gelated organometallic precursor 410 formed into a two-dimensional network structure. Therefore, a hardness of the organic semiconductor compound can be regulated by regulating a ratio of the organometallic precursor 410 and the organic semiconductor 420 for a user's purpose.

Figure 4A:
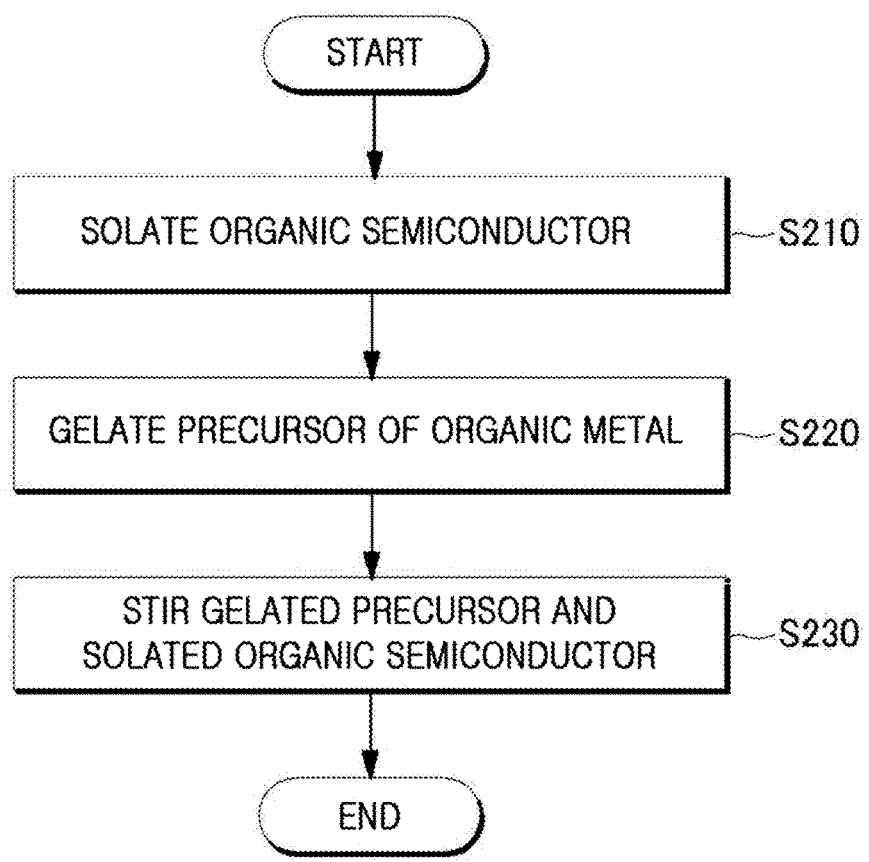
FIG. 4A is a flowchart provided to describe a method for manufacturing an organic semiconductor compound in accordance with an exemplary embodiment of the present disclosure in detail.

FIG. 4A is a flowchart provided to describe a method for manufacturing the organic semiconductor compound in accordance with an exemplary embodiment of the present disclosure in detail, and FIG. 4B is a flowchart provided to describe a method for manufacturing the organic semiconductor compound in accordance with another exemplary embodiment of the present disclosure in detail.

Referring to FIG. 4A, a method for manufacturing the organic semiconductor compound according to an exemplary embodiment of the present disclosure includes: solation of an organic semiconductor (S210); gelation of the organometallic precursor (S220); and stirring of the gelated organometallic precursor and the solated organic semiconductor (S230).

In the solation of the organic semiconductor (S210), the organic semiconductor may be dissolved in an organic solvent and then solated. Herein, a material used as the organic solvent may include one of chloroform, dichloromethane, acetone, pyridine, tetrahydrofuran, toluene, chlorobenzene, dichlorobenzene, or a mixed solution thereof.

Further, generally, the organic semiconductor used herein is not particularly limited, but desirably, a material with high carrier mobility may be used. To be specific, examples of the organic semiconductor may include polythiophene such as poly(3-hexylthiophene), polybenzothiophene, etc., polypyrole, poly(p-phenylenevinylene) such as poly(p-phenylenevinylene), etc., polyaniline, polyacetylene, polydiacetylene, polycarbazole, polyfuran, polyfuran such as polybenzofuran, etc., polyheteroaryl including, as a constituent unit, a nitrogen-containing aromatic ring such as pyridine, quinoline, phenanthrolin, oxazole, oxadiazole, etc., a condensed polycyclic aromatic compound such as anthracene, pyrene, naphthacene, pentacene, hexacene, rubrene, etc., a nitrogen-containing aromatic compound such as furan, thiophene, benzothiophene, dibenzofuran, etc., an aromatic amine derivative represented by 4,4'-bis(N-(3-methylphenyl)-N-phenylamino biphenyl, a biscarbazol derivative such as bis(N-allyl carbazol) or bis(N-alkyl carbazol), a biscarbazol derivative, a pyrazoline derivative, a stilbene-based compound, a hydrazine-based compound, phthalocyanine such as copper phthalocyanine, etc., metal porphyrin such as copper porphyrin, etc., a distyrylbenzene derivative, an aminostyryl derivative, an aromatic acetylene derivative, condensed tetracarboxylic diimide such as naphthalene-1,4,5,8-tetracarboxylic diimide, perylene-3,4,9,10-tetracarboxylic diimide, etc., and an organic pigment such as merocyanine, phenoxazine, rhodamine, etc.

Then, in the gelation of the organometallic precursor (S220), the organometallic precursor may be formed into a ladder-like two-dimensional network structure through a hydrolysis and condensation reactions.

When the organometallic precursor is gelated, a ladder-like two-dimensional network may be formed at a specific temperature (approximately between 40° C. and 90° C.). Herein, the organometallic precursor may contain metal M and a reactor X. Herein, the reactor X may be formed by synthesizing various materials suitable for purposes. Therefore, in the step S220, the organometallic precursor may be gelated into a two-dimensional network structure through a gelation process including a hydrolysis and condensation reactions.

Generally, the metal may include one or more metals selected from the group consisting of Sc, Ti, V, Cr, Mn, Fe, Co, Ni, Si, Cu, Zn, Pd, Ag, Au, Hg, Pt, Ta, Mo, Zr, Ta, Mg, Sn, Ge, Y, Nb, Tc, Ru, Rh, Lu, Hf, W, Re, Os, Ir, Lr, Rf, Db, Sg, Bh, Hs, Mt, Ds, Rg, and Uub, but is not necessarily limited thereto.

Further, the reactor X may be individually selected from hydrogen, an alkyl group, a cycloalkyl group, a heterocyclic group, an alkenyl group, a cycloalkyl group, an alkynyl group, an alkoxy group, an alkylthio group, an arylether group, an arylthioether group, an aryl group, a heteroaryl group, a halogen group, a cyano group, a formyl group, an alkylcarbonyl group, an arylcarbonyl group, a carboxyl group, an alkoxycarbonyl group, an aryloxycarbonyl group, an alkylcarbonyl group, an arylcarbonyl group, a carbamoyl group, an amino group, or a silyl group.

Then, in the stirring of the gelated organometallic precursor and the solated organic semiconductor (S230), the solated organic semiconductor in FIG. 1B and the gelated organometallic precursor in FIG. 1E are stirred while a predetermined temperature is maintained. As a result, it is possible to form the organic semiconductor compound having the three-dimensional network structure formed into a shape in which the solated organic semiconductor orthogonally penetrates one or more gaps in the lattice structure of the gelated organometallic precursor, as illustrated in FIG. 1C and FIGS. 3A-3B. Herein, when the solated organic semiconductor in FIG. 1B and the gelated organometallic precursor in FIG. 1E are mixed and thoroughly stirred, a temperature of the mixture of the solated organic semiconductor and the gelated organometallic precursor may be about 80° C., but may not be limited thereto.

Meanwhile, according to another exemplary embodiment of the present disclosure, as illustrated in FIG. 2A-FIG. 2E, the organic semiconductor compound having the three-dimensional network structure may be formed by mixing and stirring the solated organic semiconductor in FIG. 2A and the solated organometallic precursor in FIG. 2B.

To be specific, if the solated organometallic precursor in FIG. 2E is stirred with the solated organic semiconductor in FIG. 2A, gelation of the organometallic precursor occurs. Then, the organic semiconductor in FIG. 2A, which is not involved in the gelation of the organometallic precursor, may orthogonally penetrate one or more gaps in the lattice structure of the gelated organometallic precursor, so that the organic semiconductor compound having the three-dimensional network structure may be formed.

Referring to FIG. 4B, a method for manufacturing the organic semiconductor compound according to another exemplary embodiment of the present disclosure may include: solation of an organic semiconductor (S310); solation of an organometallic precursor (S320); and mixing and stirring of the solated organometallic precursor and the solated organic semiconductor (S330).

Further, it is noted that the step S210 and the step S220 illustrated in FIG. 4A are not limited to only teach that the step S210 and the step S220 are performed in a sequential order. For example, the step S210 and the step S220 may be performed in parallel. Likewise, the step S310 and the step S320 illustrated in FIG. 4B are not construed to teach that the step S310 and the step S320 limited in a sequence. For example, the step S310 and the step S320 may be performed in parallel.

EXAMPLE

Organic semiconductors (poly[2,5-bis(2-decyltetradecyl) pyrrolo[3,4-c]pyrrole-1,4(2H,5H)-dione-(E)-(1,2-bis(5-(thiophen-2-yl)thiophen-2-yl)ethene] (P-24-DPPDBTE), poly[(E)-2,7-bis(2-decyltetradecyl-4-(5-methylthiophen-2-yl)-9-(5'-(2-(5-methylthiophen-2-yl)vinyl)-[2,2'-bithiophen]-5-yl)benzo [lmn][3,8] phenanthroline-1,3,6,8(2H, 7H)-tetraone (PNDI-BTE), etc.) were solated with stirring in chlorobenzene as an organic solvent at a concentration of 5 mg/ml at a temperature of about 80° C. for 1 hour or more. Then, 0.1 µl or more of an organometallic precursor solution (1,8-bis(trichlorosilyl)octane) was put into the solated organic semiconductor solution, and then gelated with stirring at a temperature of about 80° C. for about 30 minutes or more. Likewise, the organic semiconductor compound was manufactured with stirring at a temperature of about 80° C. for 1 hour and 30 minutes or more. Herein, all of the processes were performed in a glove box with a device capable of being adjusted in a temperature and stirring at the same time.

Then, the manufactured organic semiconductor compound was coated on a silicon wafer with a spin coater within the glove box. Thereafter, a thin film was formed on the silicon wafer by performing an annealing process at a temperature of about 150° C. or above for at least 1 hour. A thickness of the manufactured thin film was measured with an atomic force microscope (AFM), and the measured thickness ranged from about 20 nm to about 30 nm, which is the same as a thickness of a pure organic semiconductor.

Hereinafter, characteristics of the organic semiconductor compound according to an exemplary embodiment of the present disclosure will be compared with those of a conventional pure semiconducting polymer with reference to FIG. 5 to FIG. 7.

FIGS. 5A-5F provide images comparing a chemical resistance of the organic semiconductor compound in accordance with an exemplary embodiment of the present disclosure with a chemical resistance of a conventional pure semiconducting polymer.

Figure 5A:
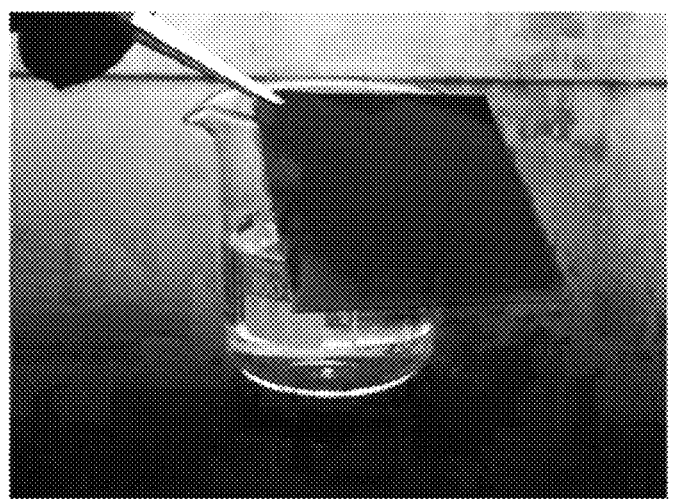
FIG. 5A-FIG. 5F provide images comparing a chemical resistance of an organic semiconductor compound in accordance with an exemplary embodiment of the present disclosure with a chemical resistance of a conventional pure semiconducting polymer.
Figure 5B:
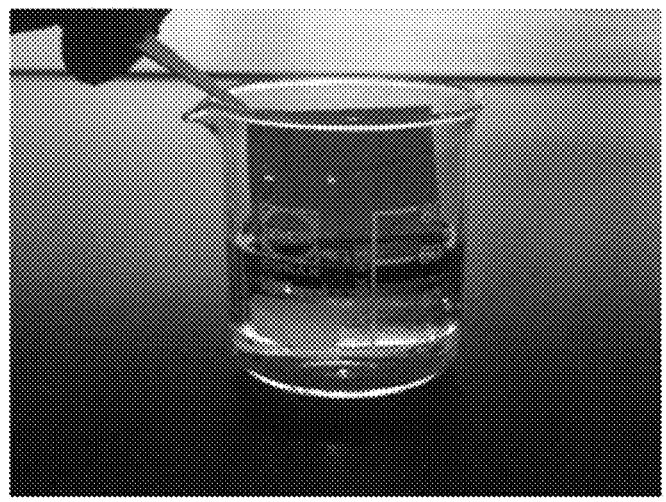
Figure 5C:
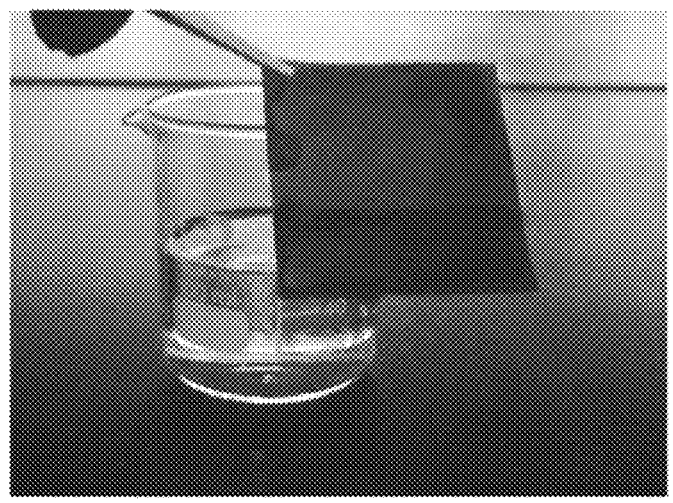
Figure 5D:
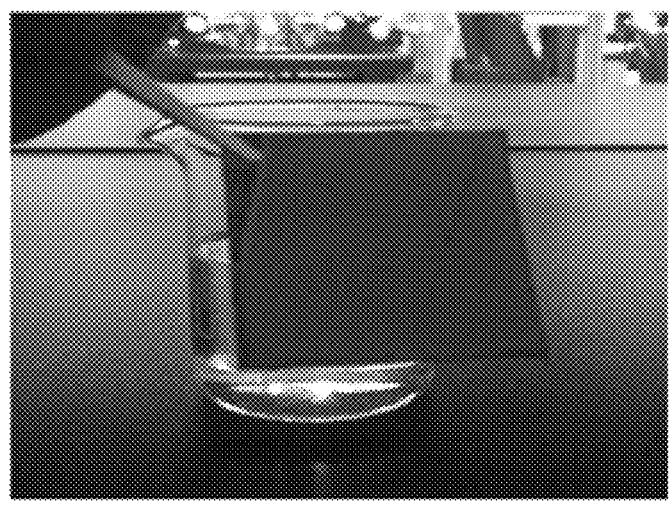
Figure 5E:
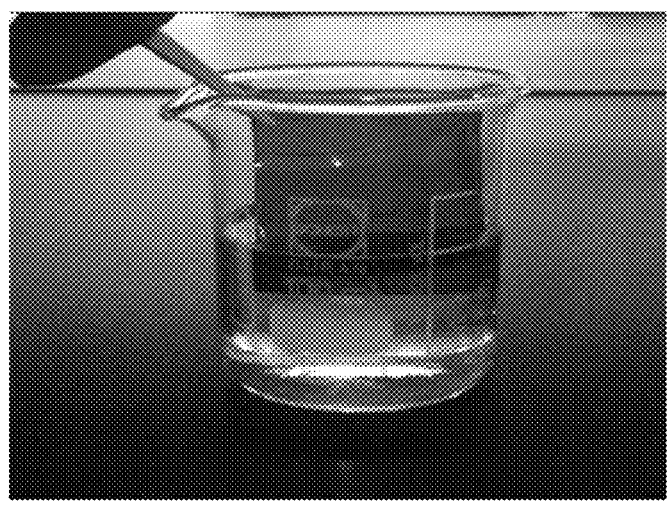
Figure 5F:
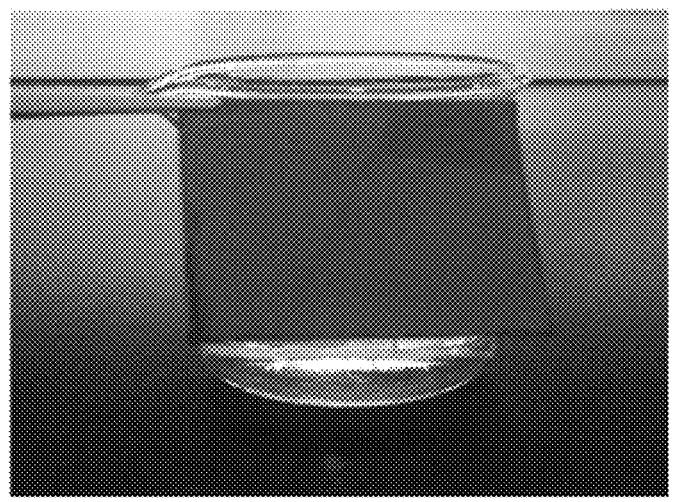

For example, FIG. 5A-5C provide images of tests for comparing the chemical resistance of a thin film formed of a pure semiconducting polymer while FIG. 5D-5F provide the chemical resistance of a thin film formed of the organic semiconductor compound according to an exemplary embodiment of the present disclosure.

In order to conduct a test of a chemical resistance of a thin film formed of the organic semiconductor compound according to an exemplary embodiment of the present disclosure, each of the thin film formed of a pure semiconducting polymer and the thin film formed of the organic semiconductor compound according to an exemplary embodiment of the present disclosure were immersed in a chlorobenzene solution, one of solvents capable of dissolving an organic semiconductor, and then, a solubility was checked.

As a result of comparison in a status of the pure semiconducting polymer between before immersion FIG. 5A and after immersion FIG. 5C, it was observed that the semiconducting polymer thin film immersed in the organic solvent was dissolved by the organic solvent and clearly distinguished as a line. However, it was observed that in the organic semiconductor compound manufactured according to an exemplary embodiment of the present disclosure, there was no difference between before immersion FIG. 5D and after immersion FIG. 5F in the organic solvent. That is, the thin film formed of the organic semiconductor compound manufactured according to an exemplary embodiment of the present disclosure was not dissolved by the organic solvent. This shows that the organic semiconductor compound manufactured according to an exemplary embodiment of the present disclosure has a chemical resistance to an organic solvent.

Generally, in the case of an organic semiconductor having a high solubility in an organic solvent at room temperature, an organic semiconductor may be manufactured by inducing self-assembly by using non-solvent molecules having an extremely limited solubility in a solvent. Further, a self-assembly may be manufactured by a dual solvent interfacial self-assembly method. Herein, the dual solvent interfacial self-assembly method uses various solubilities of an organic semiconductor material depending on a solvent. However, according to this method, some molecules with very strong interactions between side chains may generate precipitates due to rapid crystallization. In order to suppress this phenomenon, a self-assembly speed may be reduced by using two solvents which are different in density, so that crystallization between molecules at an interface may occur. However, in the case of the solution process, an unintended doping effect caused by solvent molecules can be a problem.

Meanwhile, it was observed that the organic semiconductor compound according to an exemplary embodiment of the present disclosure was formed into the three-dimensional network structure by stirring the gated organometallic precursor and the solated organic semiconductor and had a chemical resistance to the organic solvent (FIG. 5F). Therefore, it is possible to solve various problems to be considered when the above-described general organic semiconductor thin film is manufactured.

In particular, the organic semiconductor compound according to an exemplary embodiment of the present disclosure has a strong chemical resistance to an organic solvent, which is suitable for a continuous solution process using various organic solvents. Therefore, it is possible to manufacture an ultrahigh-resolution tandem-type organic electronics platform by using the organic semiconductor compound according to an exemplary embodiment of the present disclosure.

Figure 6A:
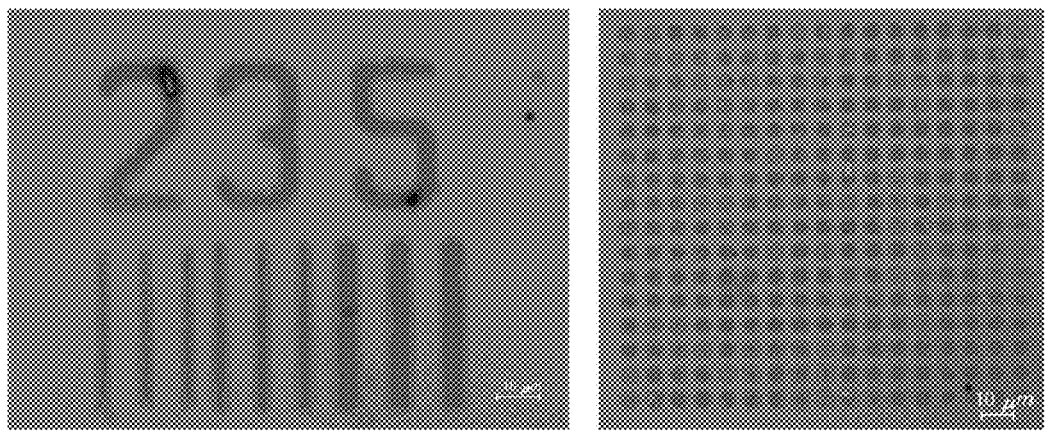
FIG. 6A-FIG. 6B provide images comparing a shape of a channel formed by using an organic semiconductor compound in accordance with an exemplary embodiment of the present disclosure with a shape of a channel formed by using a conventional pure semiconducting polymer.
Figure 6B:
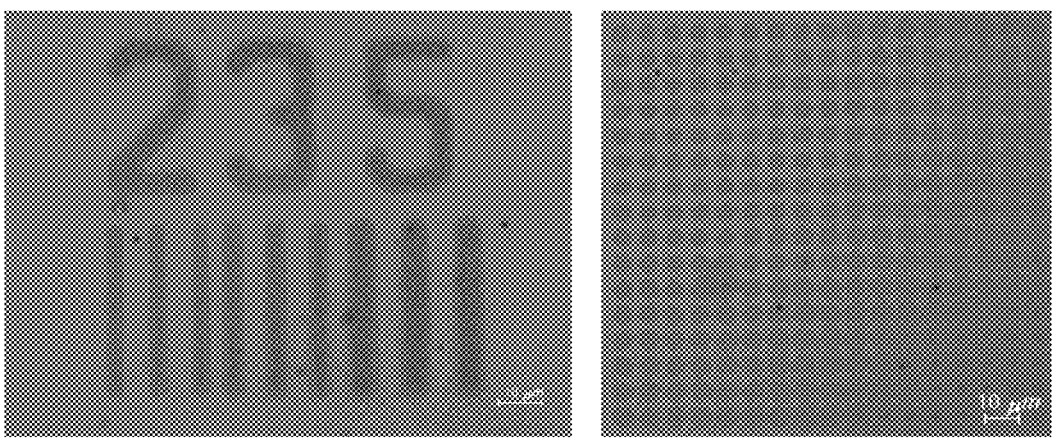

Then, FIG. 6A-FIG. 6B provide images comparing a shape of a channel formed by using the organic semiconductor compound in accordance with an exemplary embodiment of the present disclosure with a shape of a channel formed by using a conventional pure semiconducting polymer.

FIG. 6A is an image showing a channel formed by using the conventional pure semiconducting polymer, and FIG. 6B is an image showing a channel formed by using the organic semiconductor compound according to an exemplary embodiment of the present disclosure. Herein, the channel may be formed by the photolithography process. For example, a pattern may be formed on the manufactured organic semiconductor compound film by using a mask to expose a specific portion of a photoresist layer. Then, a channel may be formed by performing a dry or wet etching process.

Referring to FIG. 6A, it can be seen that a shape of the channel formed by using the conventional pure semiconducting polymer is not smooth. Referring to FIG. 6B, it can be seen that a shape of the channel formed by using the organic semiconductor compound according to an exemplary embodiment of the present disclosure is very distinct.

Figure 7A:
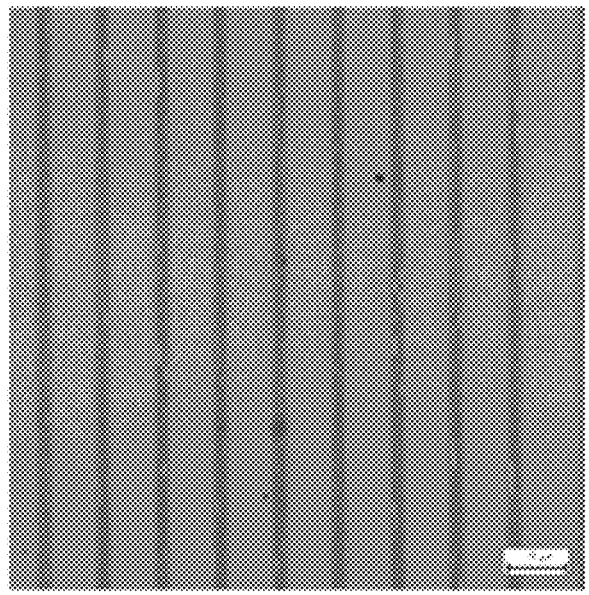
FIG. 7A-FIG. 7F provide images comparing a channel formed by using an organic semiconductor compound in accordance with an exemplary embodiment of the present disclosure with a channel formed by using a conventional pure semiconducting polymer.
Figure 7B:
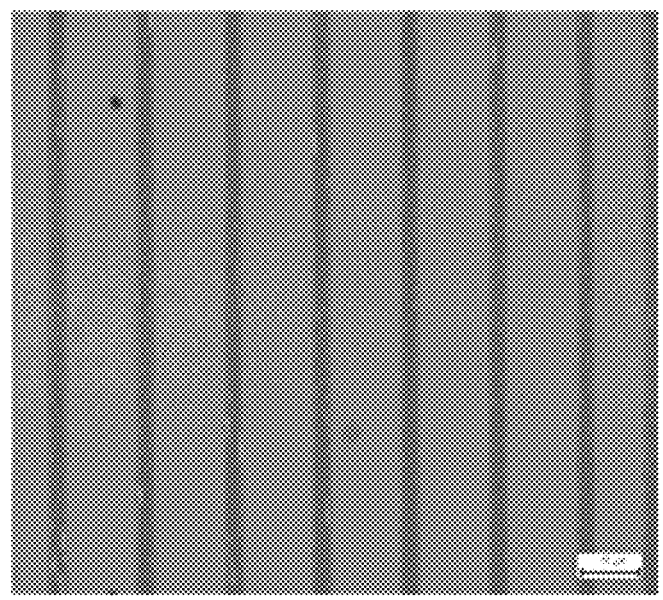
Figure 7C:
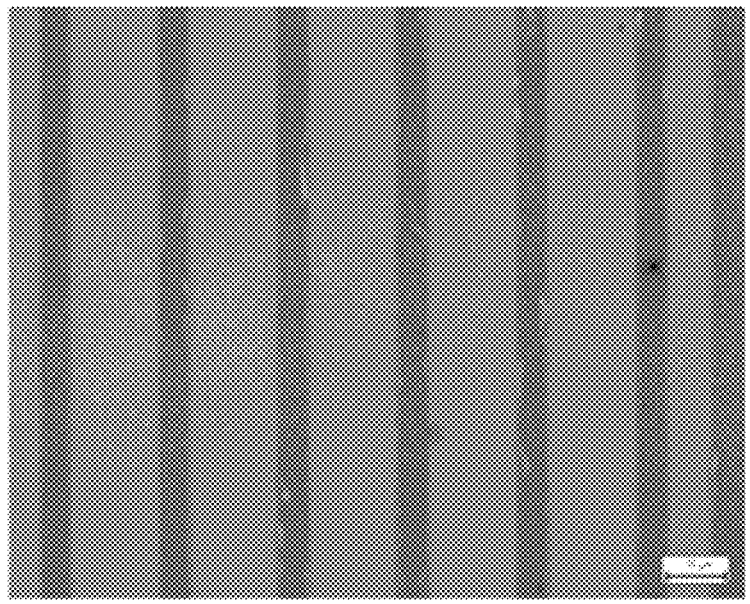
Figure 7D:
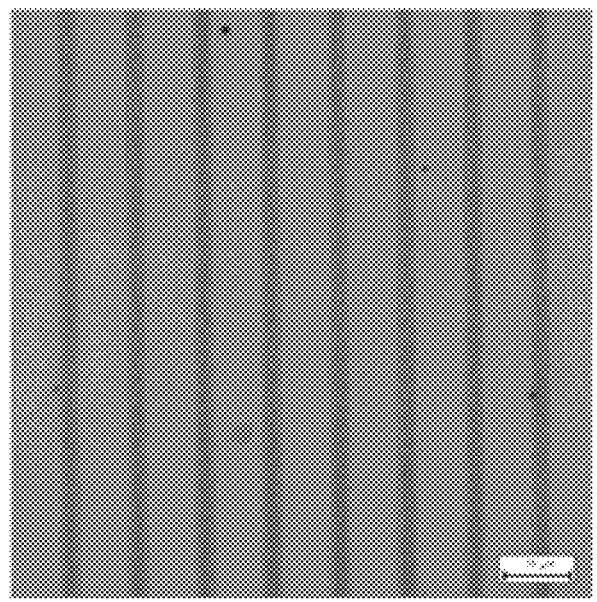
Figure 7E:
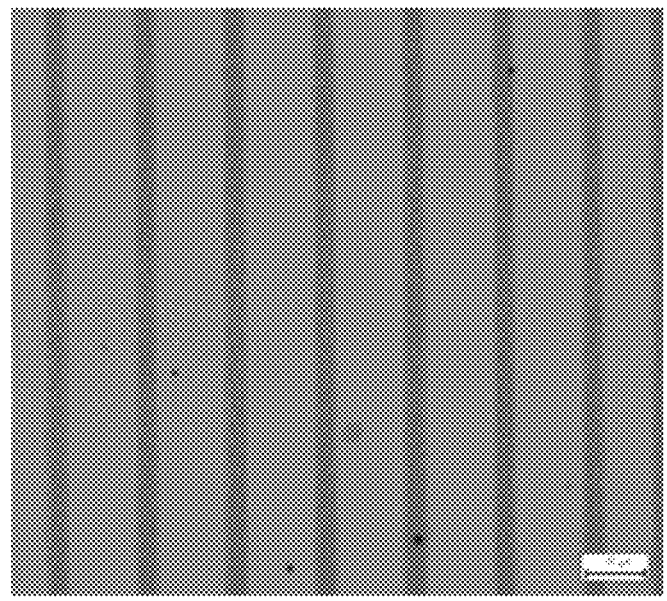
Figure 7F:
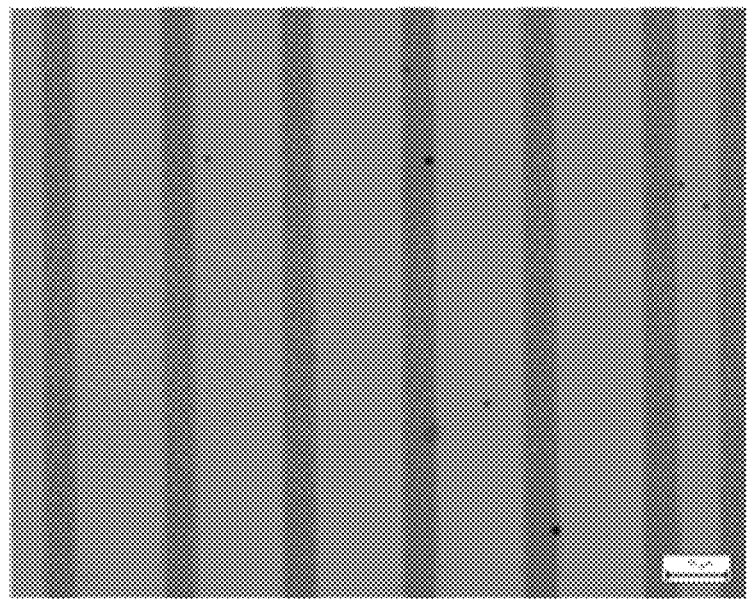

FIG. 7A FIG. 7F provide images comparing channels formed by using the organic semiconductor compound in accordance with an exemplary embodiment of the present disclosure with a channel formed by using a conventional pure semiconducting polymer.

Referring to FIG. 7A-7C, it can be seen, from the channels respectively having a width of about 2 µm (FIG. 7A), 3 µm (FIG. 7B), and 5 µm (FIG. 7C) and formed by using the pure semiconducting polymer, that at least a portion of the pure semiconducting polymer is dissolved by the organic solvent and the resulting patterns are damaged during the solution process.

However, as shown in FIG. 7D-7F, it can be seen from channels formed by using organic semiconductor compound in accordance with an exemplary embodiment of the present disclosure that patterns are distinct. This is because the patterns of the channels are not damaged by the solution process due to an improved chemical resistance.

Meanwhile, the organic semiconductor compound according to an exemplary embodiment of the present disclosure can be manufactured into various shapes. Further, the organic semiconductor compound can be applied to an optical receiver or an optical emitter for a user's purpose. For example, the organic semiconductor compound can be applied to various fields such as organic field effect transistors (OFETS), integrated circuits, organic light emitting diodes (OLEDS), photodetectors, organic photovoltaic (OPV) cells, sensors, lasers, memory elements using a multiphoton absorption phenomenon, and logic circuits. Hereinafter, an example of an electronic device using the organic semiconductor compound manufactured according to an exemplary embodiment of the present disclosure will be described in detail with reference to FIG. 8 and FIG. 9.

FIG. 8A-FIG. 8E provide diagrams illustrating a manufacturing process of an electronic device using the organic semiconductor compound in accordance with an exemplary embodiment of the present disclosure.

Figure 8A:
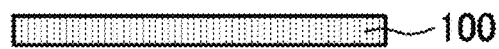
FIG. 8A-FIG. 8E provide diagrams illustrating a manufacturing process of an electronic device using an organic semiconductor compound in accordance with an exemplary embodiment of the present disclosure.
Figure 8B:
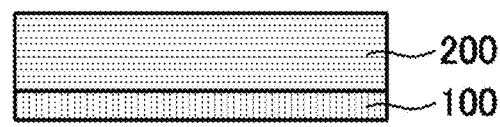

Firstly, a substrate 100 is prepared (FIG. 8A), and a silicon oxide film ($SiO_2$) 200 may be formed on an upper surface of the substrate 100 (FIG. 8B). The substrate 100 may contain any one of glass, a polymer, and silicon.

Figure 8C:
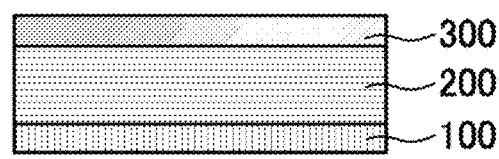

Then, octadecyltrichlorosilane (ODTS) 300 is coated on an upper surface of the silicon oxide film 200 (FIG. 8C).

Herein, the octadecyltrichlorosilane modifies surface energy of the substrate to be hydrophobic and controls an orientation of an organic semiconductor. To be specific, polymer chains present in an organic semiconductor solution are randomly aligned. The octadecyltrichlorosilane enables the polymer chains present in the organic semiconductor solution to be bidirectionally aligned when the organic semiconductor compound is coated on the substrate.

Figure 8D:
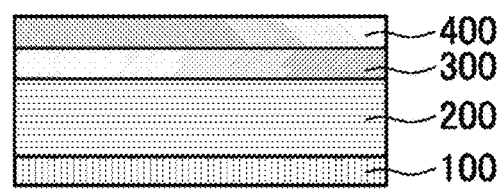

Then, the organic semiconductor compound according to an exemplary embodiment of the present disclosure is coated on an upper surface of the ODTS 300, so that a semiconductor is formed (FIG. 8D).

Generally, the semiconductor layer 400 may be formed of silicon (Si), gallium arsenide (GaAs), gallium phosphide (GaP), and gallium nitride (GaN) in part or in whole, or may contain an organic material.

Figure 8E:
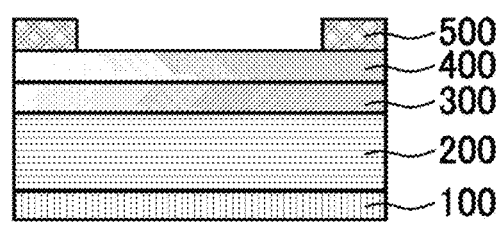

Then, as illustrated in FIG. 8E, an electrode 500 is formed on an upper surface of the semiconductor layer 400. Herein, the electrode 500 may contain any one electrode material selected from metal, conductive metal oxide, a conductive polymer, conductive carbon, a conductive nanoparticle, and a nanoparticle inserted into an organic material or a conductive material, but is not limited thereto.

According to the environment of the process, a user may deposit the electrode material to a predetermined thickness on the upper surface of the semiconductor layer 400 and manufacture a pattern of an electrode into a desired shape by the photolithography process. To be specific, photoresist may be coated on an upper surface of the deposited electrode material and a specific portion of a photoresist layer may be exposed by using a mask, so that a pattern may be formed. Then, an electrode may be formed by performing a dry or wet etching process. Herein, unnecessary photoresist may be removed by an organic solvent such as acetone.

However, in the case of forming a semiconductor layer by pursuing the conventional pure semiconducting polymer, when an electrode is formed by the above-described general photolithography process, the electrode and patterns of the semiconductor layer are often damaged by an organic solvent used in the process. However, the semiconductor layer 400 formed by using the organic semiconductor compound according to an exemplary embodiment of the present disclosure has a chemical resistance to an organic solvent, and, thus, it is possible to freely form a pattern of an electrode and a semiconductor layer for a user's purpose.

Figure 9A:
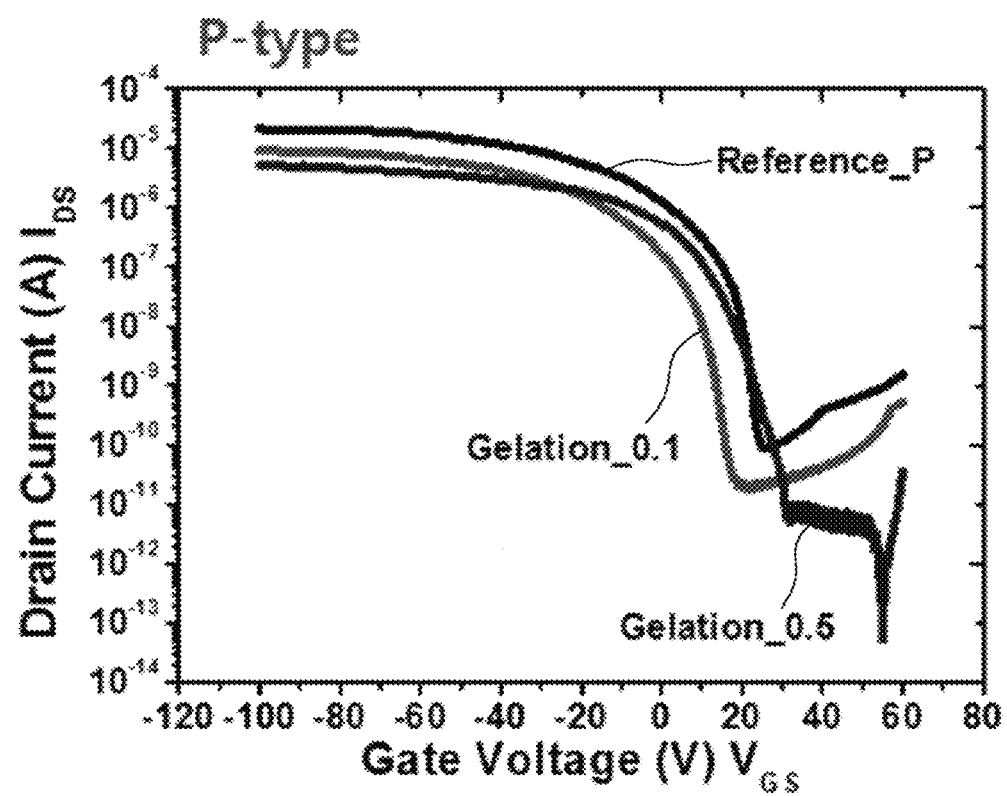
FIG. 9A-FIG. 9B provide graphs showing electrical characteristics of an electronic device using an organic semiconductor compound in accordance with an exemplary embodiment of the present disclosure.
Figure 9B:
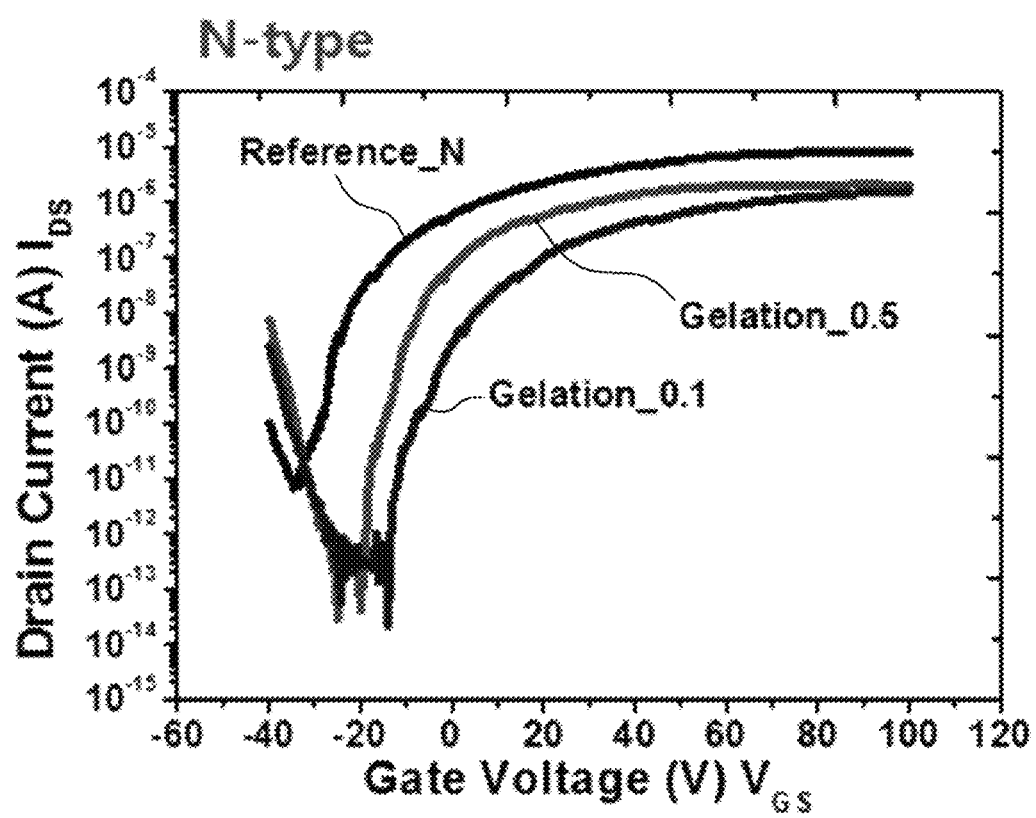

FIG. 9A-FIG. 9B provide graphs showing electrical characteristics of an electronic device using the organic semiconductor compound in accordance with an exemplary embodiment of the present disclosure. FIG. 9A shows a P-type device and FIG. 9B shows an N-type device.

In order to check electrical characteristics of an electronic device using the organic semiconductor compound in accordance with an exemplary embodiment of the present disclosure, an $I_D$-$V_{GS}$ transfer characteristic showing a relationship between a drain current $I_D$ of a gate and a voltage $V_{GS}$ between the gate and a source, and an $I_D$-$V_{DS}$ output characteristic showing a relationship between the drain current $I_D$ and a voltage $V_{DS}$ between a drain and the source were measured.

Referring to FIG. 9A, there is illustrated an $I_D$-$V_{GS}$ transfer characteristic graph, it can be seen that there is no big difference in IDs between the electronic device manufactured by using a pure semiconducting polymer solution (hereafter "a reference device") and the electronic device manufactured by using the organic semiconductor compound (hereafter "a invented device").

Referring to FIG. 9B, the drain current $I_D$ of the reference device is bigger than that of the invented device. If the drain current $I_D$ is higher than a preset value at 0V, a time spent for turning on the electronic device gets shorter. And, by a shrinkage of the turn on time, a switching performance of the electronic device may be deteriorated.

Meanwhile, the graph of the invented device is steeper than that of the reference device. Therefore an ON-OFF ratio of the invented device is better than that of the reference device.

Also, a gate voltage of the invented device at an inflection point is smaller than that of the reference device. Therefore the gate voltage of the invented device is better than that of the reference device.

That is, it can be seen that electrical characteristics can be maintained like a conventional electronic device manufactured on a silicon wafer.

Meanwhile, the organic semiconductor compound according to an exemplary embodiment of the present disclosure provides easiness in a process, and, thus, it is not necessary to synthesize a reactive group at an end of a molecule. That is, since the reactive groups that directly interfere with a movement of a carrier of the organic semiconductor are small in number, electrical characteristics of the organic semiconductor can be maintained.

Meanwhile, it is possible to synthesize various reactors with the organometallic precursor to be bonded to the organic semiconductor. Therefore, the organometallic precursor can be used as various electronic devices and a material for manufacturing an electronic device. For example, it can be used for forming a semiconductor layer or film, and can be used in an organic semiconductor device including an organic semiconductor film. For example, the organic semiconductor device may be any one of an organic thin film transistor, an integrated circuit, an organic light emitting diode, a photodetector, an organic photovoltaic cell, a sensor, a laser, a memory element using a multiphoton absorption phenomenon, and a logic circuit, but is not limited thereto.

Further, the organic semiconductor compound manufactured according to an exemplary embodiment of the present disclosure can be used as an active layer of an organic solar cell. Herein, the active layer refers to a layer in which excitons generated by a photoreaction in the organic solar cell are separated. Therefore, like a PN-junction depletion layer of a silicon solar cell, the active layer may include a donor layer and an acceptor layer. Desirably, an organic material used for the donor layer may be a material which is highly photoreactive and capable of easily generating excitons by sunlight, and desirably, an organic material used for the acceptor layer may be a material with high electron affinity.

Further, the organic semiconductor compound manufactured according to an exemplary embodiment of the present disclosure may be used for a semiconductor layer of an organic thin film transistor. According to a structure of an organic thin film transistor device, two electrodes, i.e., a source electrode and a drain electrode, are placed on an organic semiconductor layer and a gate electrode is placed under an insulating layer. Herein, the organic semiconductor layer may be formed of the organic semiconductor compound manufactured according to an exemplary embodiment of the present disclosure.

In particular, an organic thin film transistor manufactured by using the organic semiconductor compound according to an exemplary embodiment of the present disclosure has advantages such as a low-cost manufacturing process, a simple device manufacturing process, flexibility of a device, low power consumption, and biocompatibility. Therefore, the organic thin film transistor can be applied to flexible active matrix displays, radio-frequency identification (RFID) tags, and chemical and biological sensors.

Further, the organic semiconductor compound manufactured according to an exemplary embodiment of the present disclosure can be used as an emission layer of an organic light emitting diode. Generally, organic light emitting diodes are classified into a low-molecular or mono-molecular organic light emitting diode and a polymer organic light emitting diode depending on a material of an emission layer. However, a conventional organic thin film is dissolved in an organic solvent in many cases, and, thus, there are limitations in forming R, G, and B pixels and forming an electrode pattern. However, since the organic semiconductor compound according to an exemplary embodiment of the present disclosure has a chemical resistance to an organic solvent, it is useful in forming R, G, and B pixels and forming an electrode pattern.

The above description of the present disclosure is provided for the purpose of illustration, and it would be understood by those skilled in the art that various changes and modifications may be made without changing technical conception and essential features of the present disclosure. Thus, it is clear that the above-described Examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method for manufacturing an organic semiconductor composition, comprising:
    mixing a solated organic semiconductor and a gelated organometallic precursor, and
    forming a three-dimensional organic semiconductor composition by allowing the solated organic semiconductor to orthogonally penetrate one or more gaps in a lattice structure of the gelated organometallic precursor,
    wherein the gelated organometallic precursor is formed into a two-dimensional network structure.

2. The method for manufacturing the organic semiconductor composition of claim 1,
wherein the gelated organometallic precursor is gelated through hydrolysis and condensation reactions of an organometallic precursor.

3. The method for manufacturing the organic semiconductor composition of claim 1,
wherein the manufacturing of the organic semiconductor composition is performed at a predetermined temperature.

4. The method for manufacturing the organic semiconductor composition of claim 3,
wherein the predetermined temperature is about 80° C.

5. The method for manufacturing the organic semiconductor composition of claim 1,
wherein the solated organic semiconductor is solated by dissolving an organic semiconductor in an organic solvent.

6. The method for manufacturing the organic semiconductor composition of claim 5,
wherein the organic solvent includes one of chloroform, dichloromethane, acetone, pyridine, tetrahydrofuran, chlorobenzene, dichlorobenzene, or a mixed solution thereof.

7. A method for manufacturing the organic semiconductor composition, comprising:
manufacturing the organic semiconductor composition by stirring a solated organic semiconductor and a solated organometallic precursor, and
forming a three-dimensional organic semiconductor composition by gelating the solated organometallic precursor and allowing the solated organic semiconductor to orthogonally penetrate one or more gaps in a lattice structure of the gelated organometallic precursor,
wherein the gelated organometallic precursor is formed into a two-dimensional network structure.

8. The method for manufacturing the organic semiconductor composition of claim 7,
wherein the gelated organometallic precursor is gelated through hydrolysis and condensation reactions of the solated organometallic precursor.

9. The method for manufacturing the organic semiconductor composition of claim 7,
wherein the manufacturing the organic semiconductor composition is performed at a predetermined temperature.

10. The method for manufacturing the organic semiconductor composition of claim 9,
wherein the predetermined temperature is about 80° C.

11. The method for manufacturing the organic semiconductor composition of claim 7,
wherein the solated organic semiconductor is solated by dissolving an organic semiconductor in an organic solvent.

12. The method for manufacturing the organic semiconductor composition of claim 11,
wherein the organic solvent includes one of chloroform, dichloromethane, acetone, pyridine, tetrahydrofuran, chlorobenzene, dichlorobenzene, or a mixed solution thereof.

* * * * *